United States Patent [19]
Liou et al.

[11] Patent Number: 4,769,791
[45] Date of Patent: Sep. 6, 1988

[54] ON-CHIP PULSE-WIDTH CONTROL CIRCUIT FOR SRAM MEMORIES

[75] Inventors: Jiunn-Yau Liou, San Jose; May-Lin Lee, Cupertino; Moon S. Kok, Milpitas; Gary Chang, San Jose, all of Calif.

[73] Assignee: Advanced Micro Devices, Inc., Sunnyvale, Calif.

[21] Appl. No.: 894,584

[22] Filed: Aug. 6, 1986

[51] Int. Cl.$^4$ ................................................. G11C 7/00
[52] U.S. Cl. ..................................... 365/203; 365/233; 307/265
[58] Field of Search ............... 365/233, 203, 230, 226, 365/189; 307/234, 265, 202.1

[56] References Cited

U.S. PATENT DOCUMENTS

| | | | |
|---|---|---|---|
| 4,069,429 | 1/1978 | White et al. | 307/265 |
| 4,639,615 | 1/1987 | Lee et al. | 307/202.1 |
| 4,687,951 | 8/1987 | McElroy | 307/202.1 |

Primary Examiner—Stuart N. Hecker
Assistant Examiner—Glenn A. Gossage
Attorney, Agent, or Firm—Davis Chin

[57] ABSTRACT

The circuit provides one or several banks of capacitors, the capacitors in each bank being identical in size. A single fuse for each bank of capacitors controls the connection of the capacitors to a pulse-width-determining node on each of the ATD (address-transition-detect) pulse generators of the SRAM device. Depending on the position of the fuse in the circuit, the blowing of a single fuse can either add to the capacitance at the ATD nodes or substract from it. Thus the pulse-width of all ATD pulse generators can be adjusted shorter or longer simultaneously by blowing a single fuse only.

9 Claims, 2 Drawing Sheets

ON-CHIP PULSE-WIDTH CONTROL CIRCUIT FOR SRAM MEMORIES

DISCLOSURE

Background of the Invention

The present invention relates generally to static read-write randomly accessible memory devices (SRAMs), more particularly to static RAMs which use an address-transition-detect (ATD) pulse to control bit-line pre-charging and voltage equalization, and especially to a circuit providing on-chip selection of an optimum ATD pulse width.

The speed with which such SRAMs can perform a read operation depends in part upon how rapidly the bit-lines can be: (1) equalized in voltage; and (2) brought to the appropriate pre-charge voltage level. For example, in one scheme, the bit-lines are pre-charged to a voltage of approximately $V_{cc}/2$, or $\frac{1}{2}$ the $V_{cc}$ circuit supply voltage prior to sensing the data in the cell which is being addressed. The pre-charging transistors which provide the current for this operation are gated on by the ATD pulse from an ATD pulse generator, which simultaneously gates an equalizer transistor on to equalize the voltage on the bit lines.

The width of the ATD pulse needs to be carefully adjusted to provide just enough time to permit the bit-lines to equalize at a voltage near the $V_{cc}/2$ or other sense level at the end of the ATD pulse. If the ATD pulse is too long, then the start of the read operation is needlessly delayed, since the read cannot being while the bit-lines are being held at equal voltages. If the ATD pulse is too short, there will not be time enough to permit the bit-lines to reach the same pre-charge voltage level, and the resultant imbalance can be enough to delay or even prevent the reading of correct data.

The ATD pulse width has typically been controlled by altering the external capacitance connected to one or more nodes internal to the ATD pulse generator. The output pulse width of the ATD pulse generator is a function of the size of the capacitance present at each of these nodes. However, choosing the appropriate values for these capacitances to achieve optimum ATD pulse width has proven difficult because of inevitable variations in device characteristics which affect the length of ATD pulse needed.

Consequently, the use of a metal mask forming connections between the nodes of the ATD pulse generators on a wafer and a bank of preselected, fixed capacitors has resulted in pulse widths which were far from optimum. In some cases, the resultant SRAM device was significantly slower than optimum, and in extreme cases, the SRAM was inoperative.

In order to permit optimization of the capacitance connected to the ATD pulse generator nodes, the conductive connection between each node and its corresponding capacitance was made to include a polysilicon fuse, such that the capacitance could be disconnected by blowing this fuse with a laser to shorten the pulse width. However, this approach was not satisfactory for two reasons: (1) Since the SRAM devices required one ATD pulse generator for each address, and each ATD might have more than one node, it was necessary to blow too many fuses to adjust the pulse widths; (2) Once blown, the fuses could never be made conductive again. If blowing a set of fuses resulted in too short a pulse width, the device could be ruined.

SUMMARY OF THE INVENTION

One object of the present invention is to provide an SRAM having enhanced speed of operation;

A second object of the present invention is to provide an SRAM having ATD pulses of a width which can be shortened or lengthened to optimize speed of operation;

A third object of the present invention is to provide an SRAM in which the ATD pulse widths for all addresses can be altered simultaneously;

A fourth object of the present invention is to provide an SRAM in which the ATD pulse widths can be simply adjusted;

A fifth object of the present invention is to provide an SRAM in which the ATD pulse widths can be shortened by a single adjustment and lengthened by a single adjustment;

A sixth object of the present invention is to provide an SRAM in which the ATD pulse widths can be shortened by blowing one fuse and lengthened by blowing a second fuse.

To the above ends, an SRAM according to the present invention includes a common pulse width control circuit which is connected to each of the nodes on each of the ATD pulse generator circuits. A single fuse in the pulse width control circuit can alter the capacitance present at one node on each ATD pulse generator circuit. For example, blowing a single fuse can reduce the capacitance present on one node of each ATD pulse generator circuit. Similarly, blowing a second fuse can increase the capacitance present on a node of each ATD circuit.

In each of the above cases, the blowing of a single fuse alters the control voltages present on a plurality of gate transistors, each gate transistor being connected to one of the nodes affected. Each gate transistor connects a capacitor to an ATD generator circuit node when the gate transistor is in a conductive condition, and disconnects the capacitor when the gate transistor is in a non-conductive condition.

The above and other features, objects, and advantages of the present invention, together with the best mode contemplated by the inventors for carrying out their invention will become more apparent from reading the following detailed description of the invention and from studying the associated drawing, the various figures of which represent:

DETAILED DESCRIPTION OF THE PRESENT INVENTION

Figure 1:
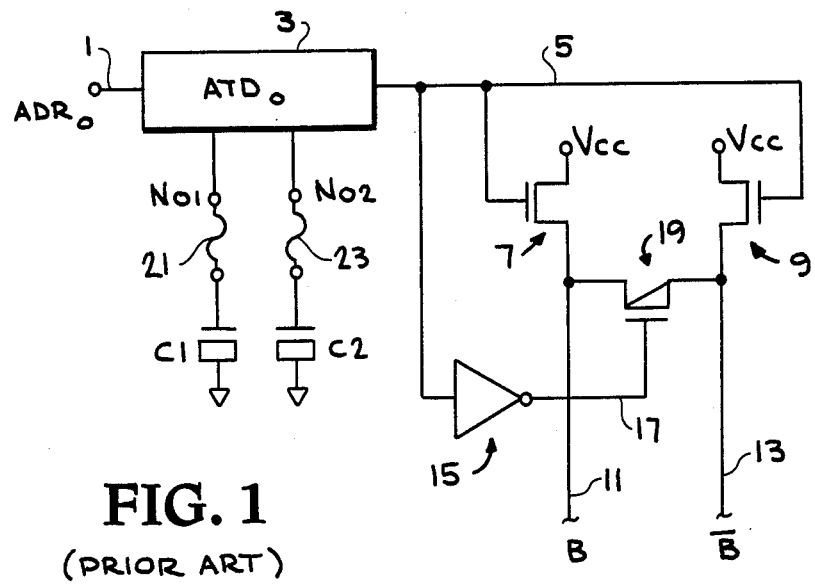
FIG. 1 is a schematic diagram, partly in block form, of an ATD pulse-controlled bit-line pre-charge circuit according to the prior art.
Figure 2:
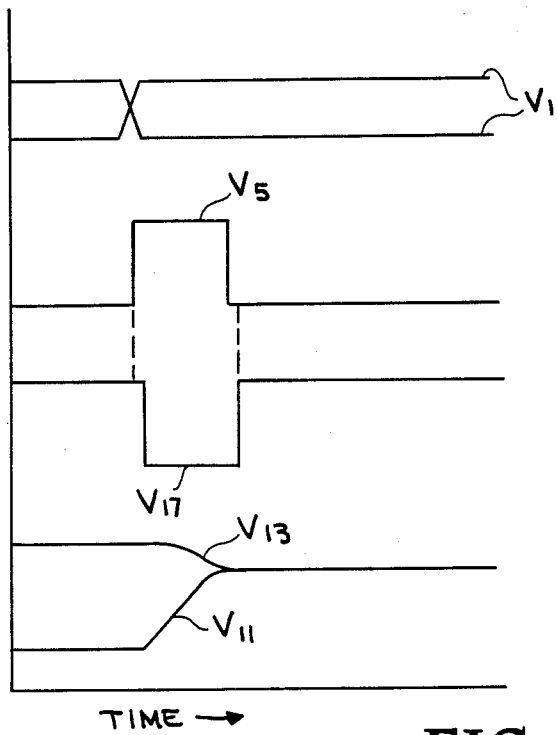
FIG. 2 is a timing diagram showing the relationships of several of the voltages in FIG. 1.

In FIG. 1, a prior art bit-line pre-charge circuit using an ATD pulse generator to control the pre-charging operation is shown. Waveforms of the voltage on several nodes of the circuit in FIG. 1 are illustrated in FIG. 2, labeled with subscripts matching the corresponding reference numbers in FIG. 1.

The circuitry illustrated in FIG. 1 is associated with a single address, the "0" address, of a matrix-array SRAM memory device. An address input 1, labeled ADR$_0$, connects to an address buffer (not shown), and receives either a positive-going or negative-going input signal V$_1$ whenever there is a change of address.

An address-transition-detect pulse generator 3, labeled ATD$_0$, puts out a positive-going pulse V$_5$ on its output line 5 whenever there is a positive or negative transition of the V$_1$ signal at its input. Output signal V$_5$ is coupled directly to the gates of a pair of n-channel pre-charge transistors 7 and 9. The source electrodes of transistors 7 and 9 are coupled to a source of positive voltage V$_{CC}$, while the drains of these transistors connect to a complementary pair of bit-lines 11 and 13, labeled B and $\bar{B}$, to pre-charge these bits-lines prior to a read operation.

When the gates of transistors 7 and 9 are driven high by the output pulse on line 5, current flows from transistors 7 and 9, and the voltage of the bit-lines 11 and 13 begins to rise toward the V$_{CC}$ level. At the same time, the output pulse on line 5 is also coupled to the input of an inverter 15, which produces a negative-going pulse signal V$_{17}$ at its output on line 17.

The negative-going pulse on line 17 is coupled to the gate of a p-channel equalizer transistor 19, which accordingly turns on and creates a conductive path between bit-lines 11 and 13, such that the one of them that was high (here, bit-line 13) at the start of the pre-charge operation can share charge with the other or low one (here, bit-line 11). Given sufficient time, the voltages on the two bit-lines will equalize, and the read operation which is to follow can begin.

The length of time during which this pre-charge operation continues is controlled by the length of the output pulse on line 5. As shown in FIG. 2, the length of the ATD pulse on line 5 is approximately correct, since the voltages on lines 11 and 13 have equalized at the end of the pulse. As discussed earlier in this application, either too long a pulse, resulting in a needless delay of the read operation, or too short a pulse, resulting in failure to equalize the bit-line voltages, will slow the operation of the SRAM device.

In order to provide some control over the pulse width of generator 3 in this prior-art circuit, a first capacitor C1 is connected to a first node N$_{01}$ through a fuse 21, and a second capacitor C2 is connected to a second node N$_{02}$ through a fuse 23. It will be understood, however, that in practice an ATD pulse generator need not always have two nodes provided for the connection of external capacitors to alter the delay. Other designs of ATD pulse generator can have 1 or more than two nodes.

The ATD pulse generator 3 produces a pulse width which is directly related to the amount of capacitance present at each of its nodes, such that blowing either fuse 21 or 23 shortens the output pulse. Accordingly, four different pulse widths are possible in the circuit of FIG. 1, corresponding to both fuses intact, both fuses blown, and either fuse 21 or fuse 23 intact, while the other one is blown.

While this degree of adjustment is sometimes adequate, the scheme often fails because once a capacitor is blown, the pulse length may become too short. Lacking any way to restore capacitance thus lost, the circuit may not produce a pulse of optimum length, resulting in inadequate speed in the associated SRAM device. Further, the necessity to blow so many fuses to adjust the pulse width for all addresses of a large matrix-array memory device makes the arrangement undesirably cumbersome.

Figure 3:
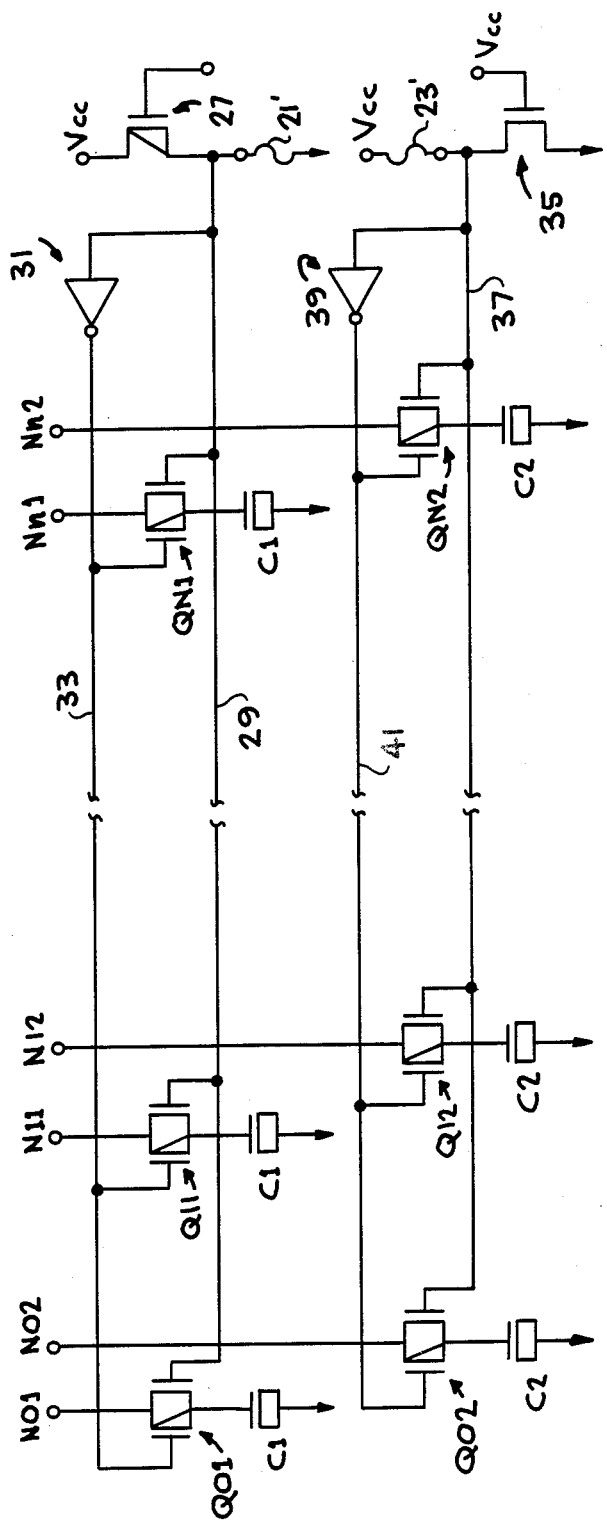
FIG. 3 is a schematic diagram of an ATD pulse-width control circuit according to the present invention.

In FIG. 3 is shown a pulse-width control circuit 25 according to the present invention. Broadly speaking, the purpose of circuit 25 is to supply the functional equivalents of capacitors C1 and C2 of FIG. 1 for all n addresses of an SRAM memory device. Accordingly, a pair of terminals, labeled N$_{01}$ and N$_{02}$ are provided for connection to the N$_{01}$ and N$_{02}$ nodes of the ATD pulse generator 3 in FIG. 1, a second pair of terminals N$_{11}$ and N$_{12}$ are provided for connection to the ATD pulse generator (not shown) associated with address "1", and similar terminals are provided for connection to the other ATD pulse generators of the SRAM device, up to address "n". In each case, circuit 25 takes the place of the separate fuses and capacitors, such as fuses 21 and 23, and capacitors C1 and C2, associated with each ATD pulse generator in the arrangement of FIG. 1.

Basically, circuit 25 consists of an array of n identical capacitors C1, an array of n identical capacitors C2, and means to selectively permit the connection or disconnection of these capacitors from the first and second nodes of the array of n ATD pulse generators of the SRAM. Each capacitor C1 is coupled to its associated node N$_{01}$–N$_{n1}$ through a dual-gate pass transistor Q01–Qn1. Similarly, each capacitor C2 is coupled to its associated node N$_{02}$–N$_{n2}$ through a dual gate pass transistor Q02–Qn2.

A p-channel leaker transistor 27 and a fuse 21' control the connection of all capacitors C1 to their associated nodes N$_{01}$–N$_{n1}$. Leaker transistor 27 has its source connected to V$_{CC}$ and its gate connected to a low voltage, such that it is biased on. The drain of transistor 27 is connected to fuse 21', which is in turn connected to a low voltage such as ground.

Leaker transistor 27 passes a small current through fuse 21' so long as the fuse is intact. The junction of transistor 27 and fuse 21' is connected to a plus-gate line 29 which extends to the n-channel or plus gates of all the pass transistors Q01–Qn1. An inverter 31 is also connected to line 29, and supplies a complementary voltage along a minus-gate line 33 to all of the p- channel or minus gates of transistors Q01–Qn1.

So long as fuse 21' is intact, the voltage on line 29 will remain low because of the connection of fuse 21' to a low voltage. Similarly, because of the inverter 31, the voltage on line 33 will remain high as long as fuse 21' is intact. Accordingly, each of the pass transistors Q01–Qn1 is cut off, isolating each of capacitors C1 from its associated ATD node.

However, if fuse 21' is blown, for example by using a laser to cut through the polysilicon conductor of which fuse 21' is typically formed, then line 29 will be raised in voltage by leaker transistor 27, line 33 will be dropped by the action of inverter 31, and each pas transistor Q01–Qn1 will conduct, connecting its capacitor C1 to one of the associated ATD nodes N$_{01}$–N$_{n1}$. Thus, the blowing of a single fuse simultaneously adds an identical capacitance C1 to each of the first nodes of all ATD pulse generators.

Pass transistors Q02–Qn2 function identically to connect or disconnect their associated capacitors C2 from the second ATD pulse generator nodes. However, a fuse 23' and a leaker transistors 35 which control the pass condition of transistors Q02–Qn2 have been illustrated in interchanged position, such that fuse 23' connects to V$_{CC}$, while leaker transistor 35 is connected to a low voltage.

Accordingly, so long as fuse 23' is intact, a plus-gate line 37 is held high, and through the action of an inverter 39, a minus-gate line 41 is held low. Consequently, capacitors C2 are connected to their associated ATD pulse generator nodes so long as fuse 23' remains intact, and can be disconnected by the blowing of fuse 23'.

In operation, circuit 25 permits the lengthening of each ATD pulse by the blowing of a single fuse 21', and the shortening of each ATD pulse by the blowing of a single fuse 23'. Moreover, although not illustrated in FIG. 3, any number of banks of capacitors such as capacitors C1 and C2 can be provided to alter the capacitance at each node of the ATD pulse generators, and the fuse and leaker transistor arrangement for each of these banks can be of the sort which either connects or disconnects the capacitors depending on whether the fuse is blown. In this way, any desired degree of control over ATD pulse length can be easily secured.

Although this invention has been described with some particularity in respect to particular embodiments thereof which comprise the best mode known to the inventors for carrying out their invention, many modifications could be made and many apparently different embodiments thus derived without departing from the scope of the invention. Consequently, the scope of the invention is to be determined only from the following claims.

We claim:

1. In a randomly accessible memory device of the type employing a plurality of memory cells in a matrix array, each memory cell being accessible by means of a pair of bit-lines, each such pair of bit-lines being provided with a bit-line pre-charging circuit for pre-charging the bit-lines and equalizing their voltage prior to a read operation, wherein each of the pre-charging circuits is provided with an ATD (address-transition-detect) pulse generator for each address producing an output pulse signal having a width or duration which determines the duration of pre-charging, each of said ATD pulse generators having at least one terminal for connection to a pulse-width-determining capacitance, the improvement comprising:

a pulse-width control circuit having a plurality of discrete pulse-width control terminals, each one of said control terminals being coupled to one of said ATD terminals;

means to simultaneously alter the capacitance present at each of said pulse-width control terminals to thereby simultaneously alter the pulse width of each of said ATD pulse generators;

said pulse-width circuit including a plurality of discrete capacitors and gated switching means for selectively connecting each one of said capacitors to a corresponding one of said pulse-width control terminals;

said gated switching means being operable in a closed state to connect each said capacitor to its corresponding pulse-width control terminal and being operable in an open state to disconnect each said capacitor from its corresponding pulse-width control terminal;

said gated switching means having a gate-signal input terminal, said gated switching means being responsive to a gate signal of a first type at said gate-signal input terminal by switching to its closed state and being responsive to a gate signal of a second type by switching to its open state;

said gate switching means further including gate-signal generating means for selectively generating a gate signal of one of said first and second types to cause said gated switching means to switch between its open and closed states and to thereby permit selective connection and disconnection of each said capacitor from its corresponding pulse-width control terminal;

said gate-signal generating means including a fuse having a first end terminal and a second end terminal, said fuse presenting a low impedance between said first and second end terminals when intact and a high impedance when blown;

said gate-signal generating means responding to the condition of said fuse by generating one of said first and second types of gate signals when said fuse is intact and the other one of said first and second types of gate signals when said fuse is blown, said first type of gate signal having a first voltage level and said second type of gate signal having a second voltage level;

said gate-signal generating means further including an electrical element having a first end terminal and a second end terminal and presenting between its first and second end terminals an impedance which is high compared to the low impedance of said intact fuse;

one of said first and second end terminals of said fuse being connected to one of said first and second end terminals of said electrical element to form a series circuit combination and having a common node therebetween; and means to impress across said series circuit combination a voltage difference of a magnitude and sense to cause said node between said fuse and said electrical element to assume one of said first and second voltage levels depending upon whether said fuse is intact or blown.

2. In a randomly accessible memory device as claimed in claim 1, wherein said electrical element comprises a transistor having source, gate and drain terminals, and wherein said first and second end terminals of said electrical element forming the series circuit combination with said fuse are said source and drain terminals.

3. In a randomly accessible memory device as claimed in claim 1, wherein said gated switching means comprises a plurality of n-channel and p-channel transistors, each of said n-channel and p-channel transistors having source, gate and drain terminals, said source and drain terminals of each one of said n-channel and p-channel transistors being coupled in series between a corresponding one of said capacitors and a corresponding one of said pulse-width control terminals.

4. In a randomly accessible memory device as claimed in claim 1, wherein said means to impress a voltage across said series combination causes one end terminal of said series combination to assume said first voltage level, and the other end terminal of said series combination to assume said second voltage level, whereby said common node assumes one of said first and second voltage levels in accordance with whether said fuse is blown or intact.

5. In a randomly accessible memory device as claimed in claim 4, wherein the other one of said first and second end terminals of said fuse of said series combination is caused to assume said first voltage level, whereby said common node assumes said first voltage level when said fuse is intact and assumes the second voltage level when said fuse is blow.

6. In a randomly accessible memory device of the type employing a plurality of memory cells in a matrix array, each memory cell being accessible by means of a pair of bit-lines, each such pair of bit-lines being provided with a bit-line pre-charging circuit for pre-charging the bit-lines and equalizing their voltage prior to a read operation, wherein each of the pre-charging circuits is provided with an ATD (address-transition-detect) pulse generator for each address producing an output pulse signal having a width or duration which determines the duration of pre-charging, each of said ATD pulse generators having at least one terminal for connection to a pulse width-determining capacitance, the improvement comprising:

- a pulse-width control circuit having a plurality of discrete pulse-width control terminals, each one of said control terminals being coupled to one of said ATD terminals;
- said pulse-width control circuit including a plurality of discrete capacitors and gated switching means for selectively connecting each one of said capacitors to a corresponding one of said pulse-width control terminals;
- said gate-switching means being operable in a closed state to connect each said capacitor to its corresponding pulse-width control terminal and being operable in an open state to disconnect each said capacitor from its corresponding pulse-width control terminal;
- said gated switching means having a gate-signal input terminal, said gated switching means being responsive to a gate signal of a first type at said gate-signal input terminal by switching to its closed state and being responsive to a gate signal of a second type by switching to its open state;
- said gated switching means further including gate-signal generating means for selectively generating a gate signal of one of said first and second types to cause said gated switching means to switch between its open and closed states and to thereby permit selective connection and disconnection of each said capacitor from its corresponding pulse-width control terminal;
- said gate-signal generating means including a fuse having a first end terminal and a second end terminal, said fuse presenting a low impedance between said first and second end terminals when intact and a high impedance when blown;
- said gate-signal generating means responding to the condition of said fuse by generating one of said first and second types of gate signals when said fuse is intact and the other one of said first and second types of gate signals when said fuse is blown, said first type of gate signal having a first voltage level and said second type of gate signal having a second voltage level;
- said gate-signal generating means further including an electrical element having a first end terminal and a second end terminal and presenting between its first and second end terminals an impedance which is high compared to the low impedance of said intact fuse;
- one of said first and second end terminals of said fuse being connected to one of said first and second end terminals of said electrical element to form a series circuit combination and having a common node therebetween; and
- means to impress across said series circuit combination a voltage difference of a magnitude and sense to cause said node between said fuse and said electrical element to assume one of said first and second voltage levels depending upon whether said fuse is intact or blown.

7. In a randomly accessible memory device as claimed in claim 6, wherein said gated switching means comprises a plurality of n-channel and p-channel transistors, each of said n-channel and p-channel transistors having source, gate and drain terminals, said source and drain terminals of each one of said n-channel and p-channel transistors being coupled in series between a corresponding one of said capacitors and a corresponding one of said pulse-width control terminals.

8. In a randomly accessible memory device as claimed in claim 6, wherein said means to impress a voltage across said series combination causes one end terminal of said series combination to assume said first voltage level, and the other end terminal of said series combination to assume said second voltage level, whereby said common node assumes one of said first and second voltge levels in accordance with whether said fuse is blown or intact.

9. In a randomly accessible memory as claimed in claim 8, wherein the other one of said first and second end terminals of said fuse of said series combination is caused to assume said first voltage level, whereby said common node assumes said first voltage level when said fuse is intact and assumes the second voltage level when said fuse is blown.

* * * * *